United States Patent
Kim et al.

(10) Patent No.: US 6,815,681 B2
(45) Date of Patent: Nov. 9, 2004

(54) ELECTRON BEAM LITHOGRAPHY APPARATUS USING A PATTERNED EMITTER

(75) Inventors: Dong-wook Kim, Seoul (KR); In-kyeong Yoo, Suwon (KR); Chang-wook Moon, Seoul (KR); In-sook Kim, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/465,600

(22) Filed: Jun. 20, 2003

(65) Prior Publication Data

US 2004/0007680 A1 Jan. 15, 2004

(30) Foreign Application Priority Data

Jul. 15, 2002 (KR) ........................................ 2002-41248
Nov. 14, 2002 (KR) ............................... 10-2002-0070661

(51) Int. Cl.[7] .............................. H01J 37/00; G01J 5/06
(52) U.S. Cl. ................. 250/338.3; 250/338.1; 250/340; 250/341.1; 250/341.6; 250/345; 250/492.1; 250/492.2; 250/492.3; 250/495.1; 250/503.1; 250/504 R; 430/296; 430/302
(58) Field of Search .......................... 250/338.1, 338.3, 250/340, 345, 341.1–6, 492.1–3, 495–504 R, 492.2, 492.3, 492.24; 430/296–302, 30; 313/310, 309, 311, 381

(56) References Cited

U.S. PATENT DOCUMENTS

| 4,139,444 | A | * | 2/1979 | Singer et al. | 204/192.3 |
| 5,293,041 | A | * | 3/1994 | Kruse, Jr. | 250/338.3 |
| 5,822,175 | A | * | 10/1998 | Azuma | 361/321.5 |
| 6,162,535 | A | * | 12/2000 | Turkevich et al. | 428/372 |
| 6,207,554 | B1 | * | 3/2001 | Xu et al. | 438/624 |
| 6,476,402 | B1 | * | 11/2002 | Yoo | 250/492.24 |
| 6,479,924 | B1 | * | 11/2002 | Yoo | 313/310 |
| 6,566,666 | B2 | * | 5/2003 | Yoo | 250/492.24 |
| 2002/0012860 | A1 | * | 1/2002 | Yoo | 430/30 |
| 2002/0173126 | A1 | * | 11/2002 | Nickles et al. | 438/502 |
| 2003/0006381 | A1 | | 1/2003 | Yoo | 250/492 |

FOREIGN PATENT DOCUMENTS

GB  2250751 A * 6/1992 ........... C23C/14/28

* cited by examiner

Primary Examiner—John R. Lee
Assistant Examiner—Bernard E. Souw
(74) Attorney, Agent, or Firm—Lee & Sterba, P.C.

(57) ABSTRACT

An electron beam lithography apparatus, which uses a patterned emitter, includes a pyroelectric plate emitter that emits electrons using a patterned metal thin layer formed on the pyroelectric plate as a mask. When the emitter is heated, electrons are emitted from portions of the emitter covered with a patterned dielectric layer, and not from portions of the emitter covered with a patterned metal thin layer, and a pattern of the emitter is thereby projected onto a substrate. To prevent dispersion of emitted electron beams, the electron beams may be controlled by a permanent magnet, an electro-magnet, or a deflector unit. A one-to-one or x-to-one projection of a desired pattern on the substrate is thereby obtained.

30 Claims, 13 Drawing Sheets

ELECTRON BEAM LITHOGRAPHY APPARATUS USING A PATTERNED EMITTER

BACKGROUND OF THE INVENTION

1. Field of the Invention

The present invention relates to an electron beam lithography apparatus using a patterned emitter. More particularly, the present invention is directed to an electron beam lithography apparatus using a pyroelectric plate on which a patterned metal thin layer is formed as an electron beam source.

2. Description of the Related Art

Conventional apparatus for performing ferroelectric switching lithography using a patterned emitter emit electrons by switching a patterned ferroelectric emitter to expose an electron resist on a substrate to form a desired pattern which is the same as that of the emitter. The conventional ferroelectric switching emission, however, has a drawback in that an electrode formed on the emitter by a mask absorbs electrons. Moreover, the emitter cannot reliably emit electrons when it is not connected to the electrode.

A lithography apparatus, which has a thermal electron source, controls an electron beam using an electro-magnetic field. In order to deploy a large-sized electron source, however, the lithography apparatus is required to include a device for collimating radially diffused electron beams. This requirement introduces complications in the design and structure of the lithography apparatus.

A photocathode projection type lithography apparatus deploys a large-sized electron source but is extremely sensitive to air pollution and therefore cannot be commercially used.

SUMMARY OF THE INVENTION

The present invention provides an electron beam lithography apparatus capable of emitting electrons using an electron beam source without applying a high voltage.

The present invention also provides a method of fabricating an electron lithography apparatus that heats an electron beam source at a low temperature to emit electrons, and a method of making the electron beam source.

According to an embodiment of the present invention, there is provided an electron beam lithography apparatus for providing a one-to-one projection of a pattern, comprising a pyroelectric emitter which is disposed from a substrate holder at a predetermined distance, the emitter including a pyroelectric plate having a patterned dielectric layer on its surface facing the substrate holder, wherein portions of the surface of the pyroelectric plate exposed by the patterned dielectric layer is covered with a metal thin layer, a heating source which heats the emitter, and a permanent magnet or an electro-magnet disposed outside the emitter and the substrate holder so as to control the paths of electrons emitted by the emitter.

Preferably, the metal thin layer is formed on the pyroelectric plate that is exposed by the patterned dielectric layer. An adhesion layer of a predetermined thickness may be formed between the pyroelectric plate, and the dielectric layer and the metal thin layer. The dielectric layer and the pyroelectric plate may be sequentially formed below the metal thin layer.

According to another embodiment of the present invention, there is provided an electron lithography apparatus for providing a x-to-one projection of a pattern, comprising a pyroelectric emitter which is disposed from a substrate holder at a predetermined distance, the emitter including a pyroelectric plate having a patterned dielectric layer on its surface facing the substrate holder, wherein portions of the surface of the pyroelectric plate exposed by the patterned dielectric layer is covered with a metal thin layer, a heating source which heats the emitter, and a deflector unit which is disposed between the emitter and the substrate holder so as to control the paths of electrons emitted by the emitter.

According to yet another embodiment of the present invention, there is provided an electron beam lithography apparatus for providing a one-to-one projection of a pattern, comprising a pyroelectric emitter which is disposed from a substrate holder at a predetermined distance, the emitter including a pyroelectric plate having a patterned metal thin layer on its surface facing the substrate holder, wherein a dielectric layer is formed on the pyroelectric plate below the patterned metal thin layer, a heating source which heats the emitter, and a permanent magnet or an electro-magnet disposed outside the emitter and the substrate holder so as to control the paths of electrons emitted from the emitter.

According to still another embodiment of the present invention, there is provided an electron beam lithography apparatus for providing a x-to-one projection of a pattern, comprising a pyroelectric emitter which is disposed from a substrate holder at a predetermined distance, the emitter including a pyroelectric plate having a patterned metal thin layer on its surface facing the substrate holder, wherein a dielectric layer is formed on the pyroelectric plate below the patterned metal thin layer, a heating source which heats the emitter, and a deflector unit which is disposed between the emitter and the substrate holder so as to change the paths of electrons emitted from the emitter.

According to a feature of the present invention, the heating source may be a contact-type heating plate using a resistive-type heating or a remotely controlled heater that generates infrared rays.

According to another feature of the present invention, the pyroelectric plate may be formed of a pyroelectric material selected from the group consisting of $LiNbO_3$, $LiTaO_3$, and $BaTiO_3$.

According to yet another feature of the present invention, the dielectric layer or the adhesion layer may be formed of a dielectric material selected from the group consisting of $SiO_2$, $Si_3N_4$, and $TiO_2$.

According to still another feature of the present invention, the metal thin layer may be formed of metal selected from the group consisting of Ti, Au, Pt, Ta, and Al.

According to another feature of the present invention, the deflector unit may include deflection plates which deflect electrons emitted from the emitter, at least one magnetic lens which collimates the deflected electrons, and an aperture which filters the collimated electrons.

According to yet another feature of the present invention, the heating source may heat the emitter to a temperature up to 120° C.

BRIEF DESCRIPTION OF THE DRAWINGS

The above and other embodiments, features and advantages of the present invention will become more apparent to those of ordinary skill in the art by describing in detail preferred embodiments thereof with reference to the attached drawings in which.

DETAILED DESCRIPTION OF THE INVENTION

Figure 1:
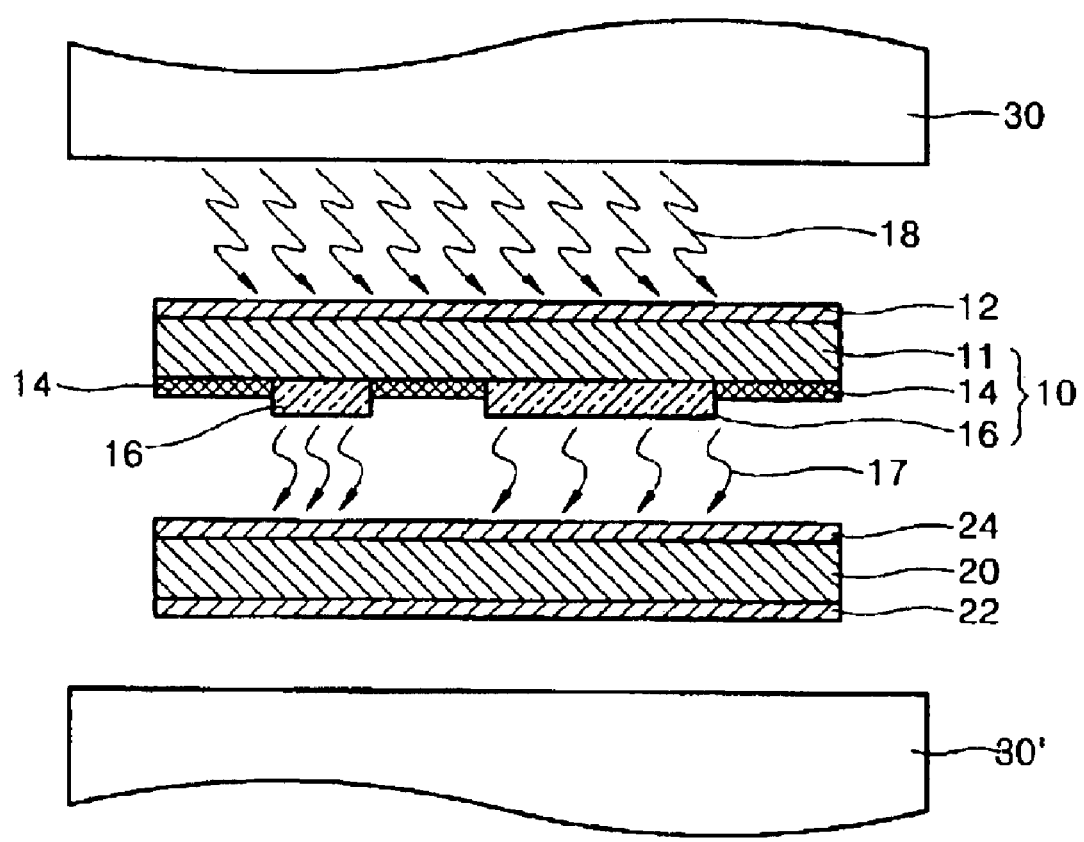
FIG. 1 illustrates a schematic, cross-sectional view of an electron beam lithography apparatus for providing a one-to-one projection of a pattern according to an embodiment of the present invention.

Korean Patent Application Nos. 2002-41248 and 2002-70661 filed on Jul. 15, 2002, and Nov. 14, 2002, respectively, and entitled "Electron Lithography Apparatus Using a Patterned Emitter," are incorporated herein in their entireties.

The present invention will now be described more fully with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. The characteristics, such as shape and thickness, of elements shown in the drawings are exaggerated for clarity. The same reference numerals in different drawings represent the same element. The terms 'electron beam' and 'electron beams' are used to describe the same element. Both terms are used to represent a group of electrons traveling in a particular direction. The term 'electrons' are also used in place of 'electron beam' and 'electron beams,' wherever it is appropriate.

Referring to FIG. 1, there is illustrated a schematic, cross-sectional view of an electron beam lithography apparatus for providing a one-to-one projection of a pattern according to an embodiment of the present invention. A substrate 20 coated with an electron resist 24 is disposed on a substrate holder 22. A pyroelectric emitter 10 is mounted on an emitter mount 12 at a predetermined distance from the substrate 20 and emits electron beams 17 when it is heated by heating radiation 18 emanating from an external heating source. The emitter 10 includes a pyroelectric plate 11, a dielectric layer 16 having a predetermined pattern formed on the pyroelectric plate 11, and a metal thin layer 14 formed at an exposed area by the dielectric layer 16 on the pyroelectric plate 11. A contact-type heating plate (not shown) can be installed on a surface of the pyroelectric plate 11, opposite to a surface facing the substrate 20, in place of the emitter mount 12, so as to supply heat to the pyroelectric plate 11. The heating plate may be a resistive-type heating plate. Electromagnets or permanent magnets 30 and 30' are disposed outside the pyroelectric plate 11 and the substrate holder 22 to control a path of the electrons emitted by the emitter 10.

The pyroelectric plate 11 is fabricated of a pyroelectric material such as $LiNbO_3$, $LiTaO_3$, and $BaTiO_3$, and emits electrons when the pyroelectric plate 11 is heated by the heating radiation 18 emanating from an external heating source or when it is heated by the heating plate (not shown) installed in contact with the pyroelectric plate 11.

Figure 2:
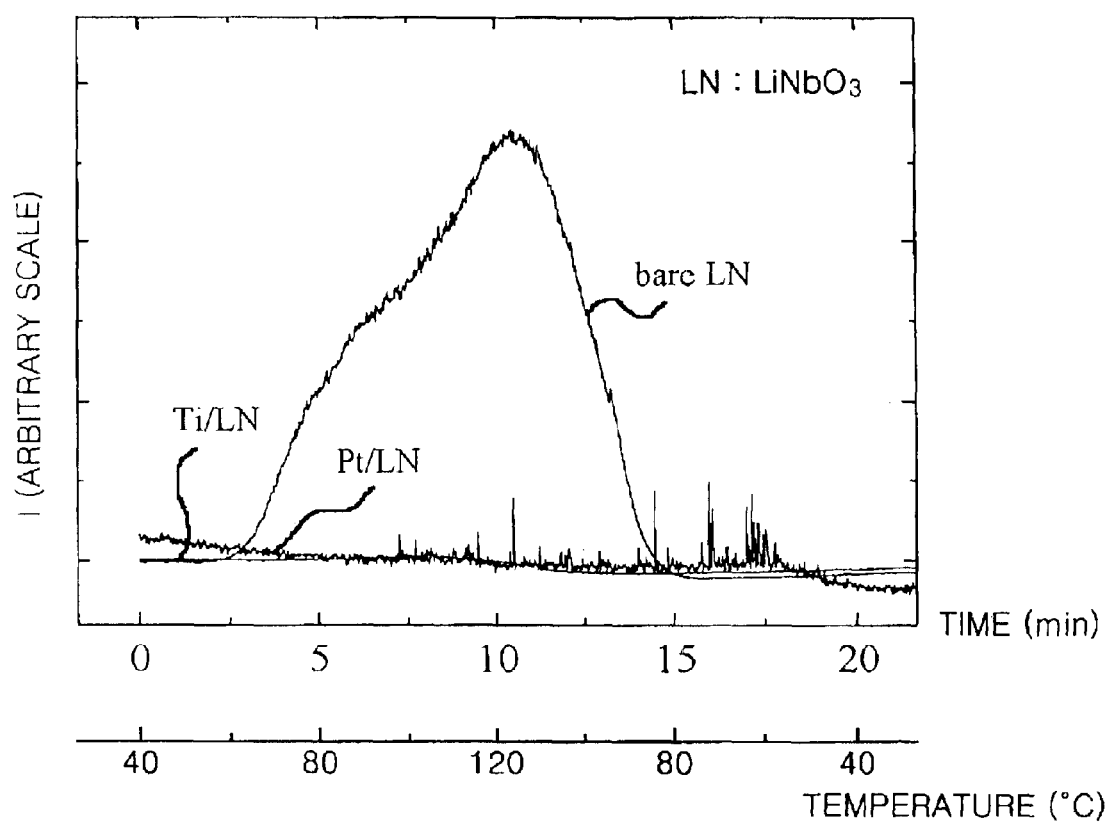
FIG. 2 is a graph illustrating a time variation in an electron beam current (I) value emitted from a $LiNbO_3$ pyroelectric plate that is coated with and without a metal thin layer when the pyroelectric plate is heated to 120° C. and then cooled to room temperature.

Referring to FIG. 2, there is illustrated a graph showing a time variation in an electron beam current (I) emitted from the heated pyroelectric plate 11 that is formed of $LiNbO_3$ (LN) to a 1 mm thickness and coated with and without a metal thin layer. No dielectric layer is formed on the pyroelectric plate 11 while recording the electron beam current time variation curves shown in FIG. 2. The $LiNbO_3$ pyroelectric plate 11 is heated from 20° C. to 120° C. and then cooled to room temperature. In the case of the $LiNbO_3$ pyroelectric plate 11 that is not coated with a metal thin layer (bare LN), an electron beam current of 10–14 A is emitted from the $LiNbO_3$ plate 11 at about 120° C. and patterns the electron resist 24 on the substrate 20. However, in the case of the $LiNbO_3$ plate 11 that is coated with a metal thin layer, such as a platinum (Pt) thin layer of about 500 Å or a titanium (Ti) thin layer, virtually no electrons are emitted from the heated $LiNbO_3$ plate 11. Therefore, the metal thin layer blocks electron emission from an area on the pyroelectric plate 11 coated with the metal thin layer.

Figure 3:
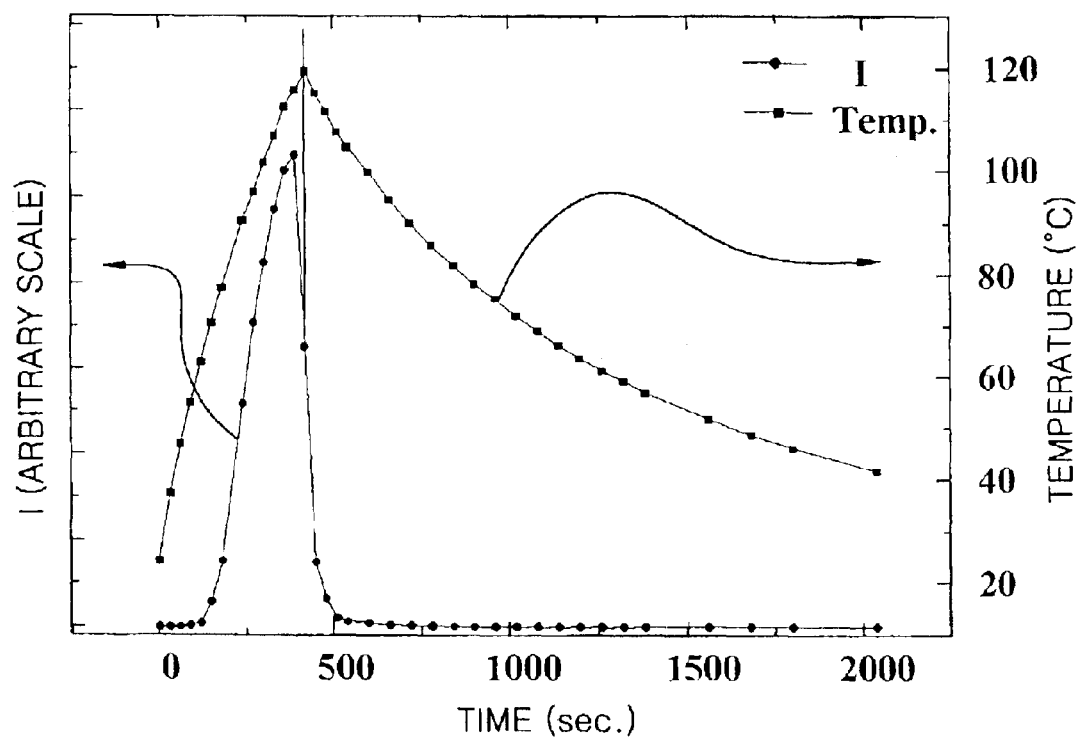
FIG. 3 is a graph illustrating a time variation in an electron beam current (I) value emitted from a pyroelectric plate when an emitter, in which a $SiO_2$ thin layer is deposited on a plate of $LiNbO_3$ pyroelectric material, is heated to 120° C. and then cooled to room temperature.

Referring to FIG. 3, there is illustrated a graph showing a time variation in an electron beam current emitted from an emitter consisting of a $LiNbO_3$ plate of a 1 mm thickness and a $SiO_2$ dielectric layer of about 1000 Å on the $LiNbO_3$ plate when the $LiNbO_3$ plate is heated from room temperature to 120° C. and then cooled to the room temperature. No metal thin layer is formed on the pyroelectric plate 11 in the sample used for recording the electron beam current time variation curve, shown in FIG. 3. Referring to FIG. 3, electrons are not emitted when heating the $LiNbO_3$ plate from room temperature, e.g., about 20° C., to about 60° C. but begin to be emitted at about 60° C., and at 120° C. electron beam required for patterning an electron resist are emitted.

The dielectric layer 16 is patterned on the pyroelectric plate 11 at predetermined locations so as to pattern the metal thin layer 14 on the pyroelectric plate 11. Therefore, preferably, the dielectric layer 16 is formed of a material such as $SiO_2$, $Si_3N_4$, or $TiO_2$ which can be patterned in nanometer scale dimensions.

Hereinafter, the operation of an electron beam lithography apparatus for providing a one-to-one projection of a pattern, according to an embodiment of the present invention, will be described with reference to FIG. 1. First, the substrate 20 coated with the electron resist 24 is disposed on the substrate holder 22 and heat is applied to the emitter 10. During the heating of the emitter 10, when the pyroelectric plate 11 is heated in vacuum, e.g., at a pressure of $2\times10^{-5}$ torr or less, to a predetermined temperature, e.g., 120° C., using the heating radiation 18 emanating from an external heating source or by a heating plate installed in contact with the pyroelectric plate 11, the electron beam 17 is emitted from the patterned dielectric layer 16. The electron beam 17 travels straight due to a DC magnetic field of 0.8 Tesla to pattern the electron resist 24 on the substrate 20. The pattern of the emitter 10, which is patterned by the metal thin layer 14, is projected onto the substrate 20 at a ratio of 1:1. For repetitive projection of the pattern, heating and cooling of the emitter 10 are repeatedly performed.

In the electron lithography apparatus, according to an embodiment of the present invention, the pyroelectric plate 11 is mounted on the emitter mount 12, but the emitter mount 12 may be replaced with a heating plate.

Also, the heating source may be a remotely controlled heater (not shown) that generates infrared rays. In this case the heating radiation 18 is in the form of infrared rays.

Figure 4:
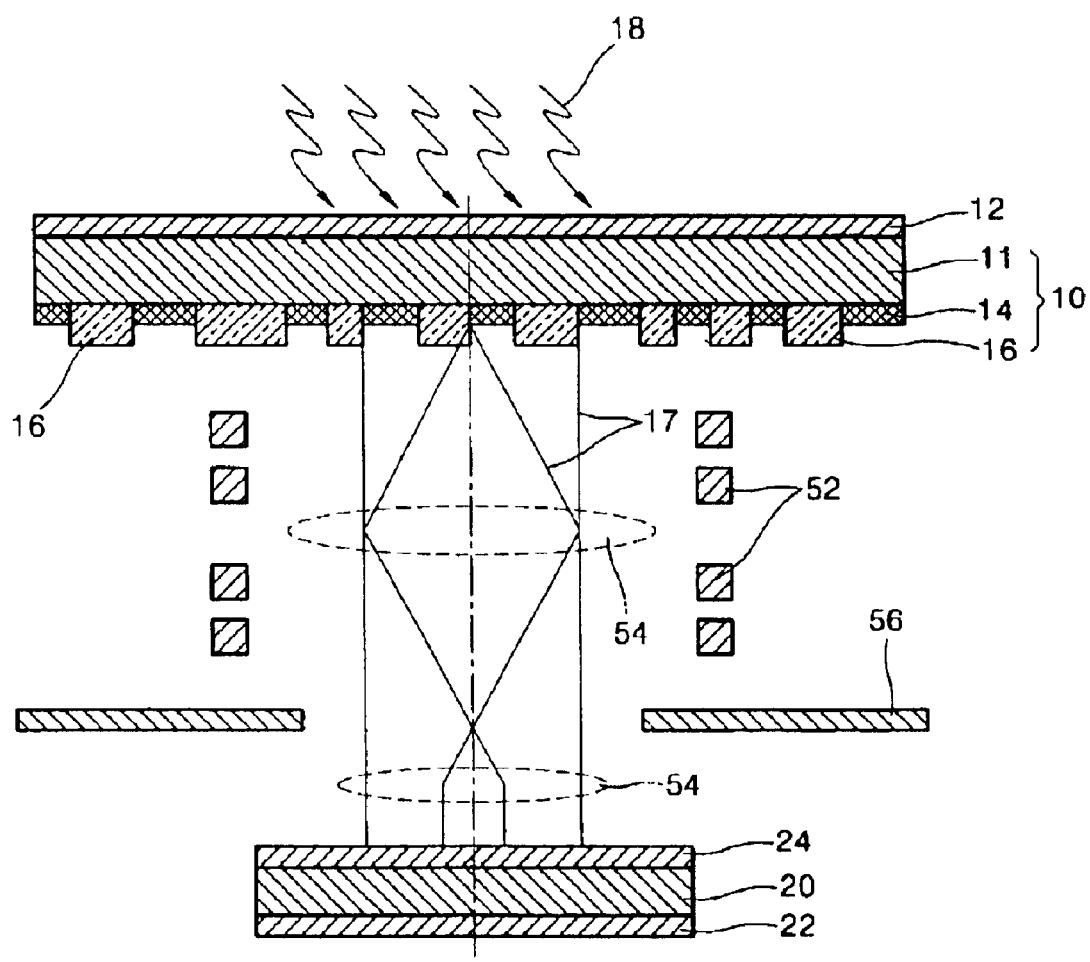
FIG. 4 illustrates a schematic, cross-sectional view of an electron beam lithography apparatus for providing an x-to-one projection of a pattern, according to another embodiment of the present invention.

Referring to FIG. 4, there is illustrated a schematic, cross-sectional view of an electron lithography apparatus for providing an x-to-one projection of a pattern according to another embodiment of the present invention. The same reference numerals are used for the same elements as those in the aforementioned embodiment of the present invention and thus their descriptions will be omitted.

Referring to FIG. 4, a substrate 20 coated with an electron resist 24 is disposed on a substrate holder 22. A pyroelectric emitter 10 is mounted on an emitter mount 12 at a predetermined distance from the substrate 20 and emits electron beam 17 when it is heated by heating radiation 18 emanating from an external heating source. The emitter 10 includes a pyroelectric plate 11 and a dielectric layer 16 having a predetermined pattern formed on the pyroelectric plate 11. A contact-type heating plate (not shown) may be installed on a surface of the pyroelectric plate 11, opposite to a surface facing the substrate 20, so as to supply heat to the pyroelectric plate 11. The heating plate may also be a resistive heating plate. Deflection plates 52, magnetic lenses 54, and an aperture 56, all of which may collectively referred to as a deflection unit, are disposed between the pyroelectric plate 11 and the substrate holder 22. The deflection unit controls the paths of electrons emitted by the emitter, and the deflection plates 52 deflect the electron beams 17 emitted by the emitter 10. The magnetic lenses 54 collimate the deflected electron beams 17, and the aperture 56 filters the collimated electron beams 17.

The pyroelectric plate 11 may be made of a pyroelectric material such as $LiNbO_3$, $LiTaO_3$, and $BaTiO_3$, and emits electrons when the pyroelectric plate 11 is heated by the heating radiation 18 emanating from an external heating source or by the heating plate (not shown) installed in contact with the pyroelectric plate 11.

Dielectric layer 16 is patterned to obtain the metal thin layer 14 pattern on the pyroelectric plate 11, and it is preferable that the dielectric layer 16 is formed of a material such as $SiO_2$, $Si_3N_4$, or $TiO_2$, that may be patterned in nanometer scale dimensions.

The operation of the electron beam lithography apparatus for providing an x-to-one projection of a pattern will now be described with reference to FIG. 4. First, the substrate 20 coated with the electron resist 24 is placed on the substrate holder 22, and then heat is applied to the emitter 10. When the pyroelectric plate 11 is heated in vacuum, e.g., at a pressure of $2\times10^{-5}$ torr or less, to a predetermined temperature, e.g., 120° C., using heating radiation 18 from an external heating source or by a heating plate (not shown) installed in contact with the pyroelectric plate 11, the electron beams 17 are emitted from the patterned dielectric layer 16. The heating radiation 18 may be infrared rays generated by a remotely controlled heater. The electron beams 17 are deflected and collimated by the deflection plates 52 and the magnetic lenses 54, thereby reducing the size of the pattern of the emitter 10.

It is preferable that the emitter 10 is heated to 120° C. in order to obtain sufficient dosage of an emitted electron beam. Also, for repetitive projection of the pattern, heating and cooling of the emitter 10 are repeatedly performed. In this case, the emitter 10 is cooled to about 60° C. and heated to 120° C. for a high throughput. About 60° C. is the threshold temperature below which electrons are not emitted.

In the electron lithography apparatus according to another embodiment of the present invention, the emitter 10 for emitting an electron beam is mounted on the emitter mount 12. The emitter mount 12 may be replaced with a heating plate.

Referring now to FIGS. 5A through 5E, there are illustrated cross-sectional views of a process of fabricating a patterned pyroelectric emitter, which is an electron beam source, according to an embodiment of the present invention. The same reference numerals are used for the same elements as those of the aforementioned embodiment and thus their descriptions will be omitted.

Figure 5A:
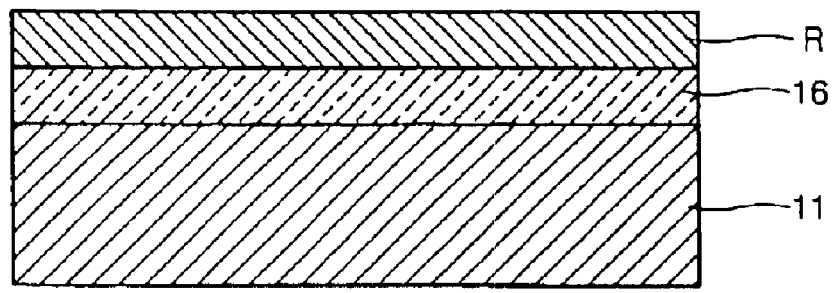
FIGS. 5A through 5E illustrate cross-sectional views of a process for fabricating a patterned pyroelectric emitter, which is an electron beam source, according to an embodiment of the present invention.

As shown in FIG. 5A, a dielectric layer 16 of a thickness of about 1000 Å is deposited on a pyroelectric plate 11 having a thickness of about 1 mm. The pyroelectric plate 11 may be formed of a pyroelectric material such as $LiNbO_3$, $LiTaO_3$, and $BaTiO_3$, and the dielectric layer 16 may be formed using a material, such as $SiO_2$, $Si_3N_4$, or $TiO_2$, that may be patterned in nanometer scale dimensions. The dielectric layer 16 is deposited on the pyroelectric plate 11 by a chemical vapor deposition (CVD) or a physical vapor deposition (PVD) technique. Next, a photosensitive resist R is coated on the dielectric layer 16.

Figure 5B:
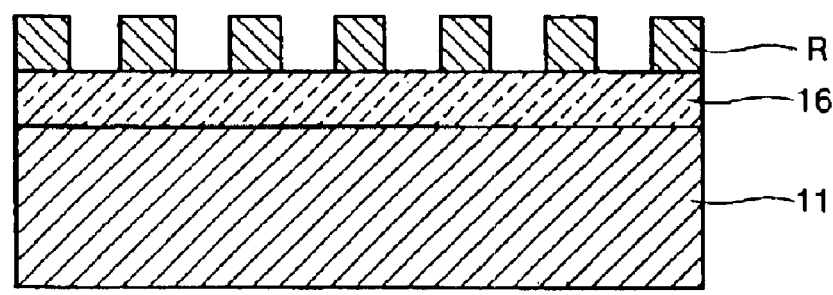

Thereafter, the photosensitive resist R is patterned through an exposure and a development by photolithography and electron beam lithography (see FIG. 5B). In this case, a LOR™ resist (not shown) (MicroChem Corp., Newton, Mass., USA) and the photosensitive resist R may be sequentially deposited on the dielectric layer 16 for the subsequent lift-off process.

Figure 5C:
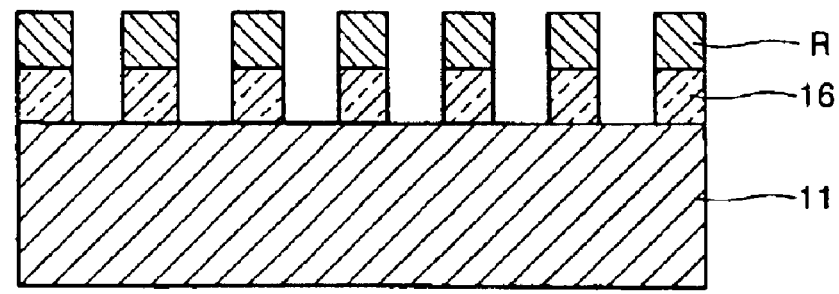
Figure 5D:
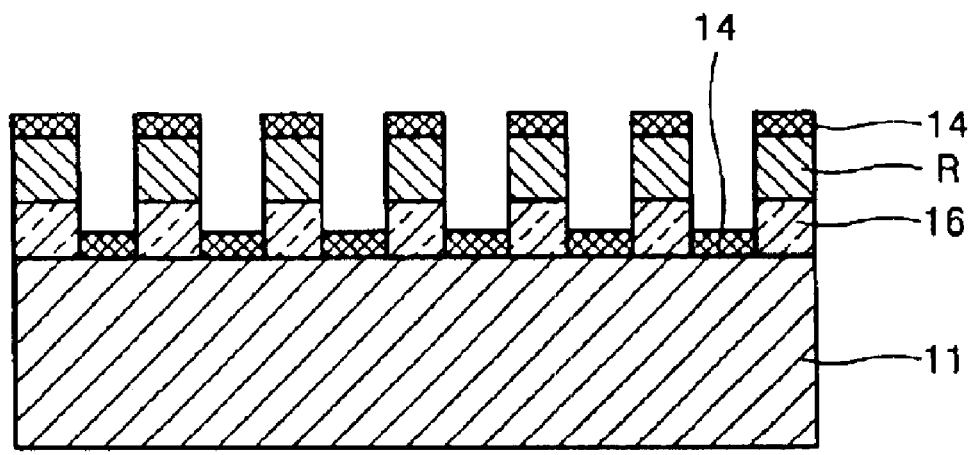
Figure 5E:
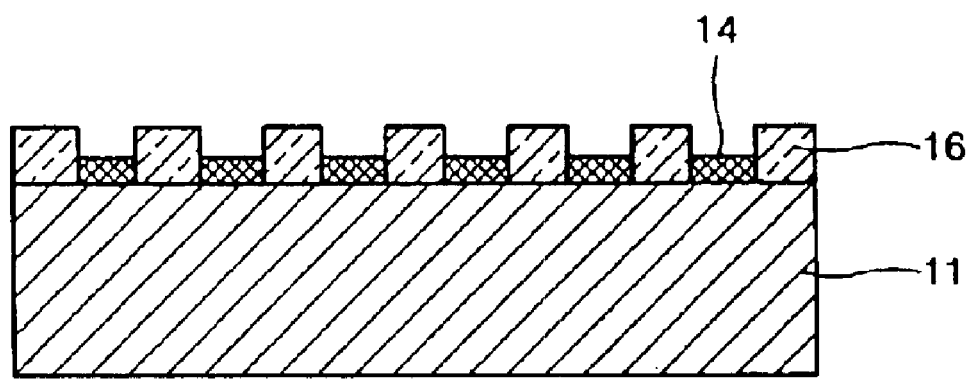

Referring to FIG. 5C, the dielectric layer 16 is then patterned by reactive ion etching (RIE) using the patterned photosensitive resist R as a mask. A metal thin layer 14 is then deposited on portions of the pyroelectric plate 11, which are exposed by the patterned dielectric layer 16 (see FIG. 5D). Preferably, the deposition of the metal thin layer 14 is performed by a vacuum evaporation technique, which has a poor step coverage. FIG. 5D shows the deposition of the metal thin layer 14 on the pyroelectric plate 11. Here, the metal thin layer 14 may be formed of Ti, Au, Pt, Ta, or Al to a thickness of about 500 Å. The remaining photosensitive pattern R is then removed using, for example, a lift-off process and ashing, to obtain a pyroelectric emitter in which the patterned dielectric layer 16 and the patterned metal thin layer 14 are formed on the pyroelectric plate 11, as shown in FIG. 5E.

Figure 6:
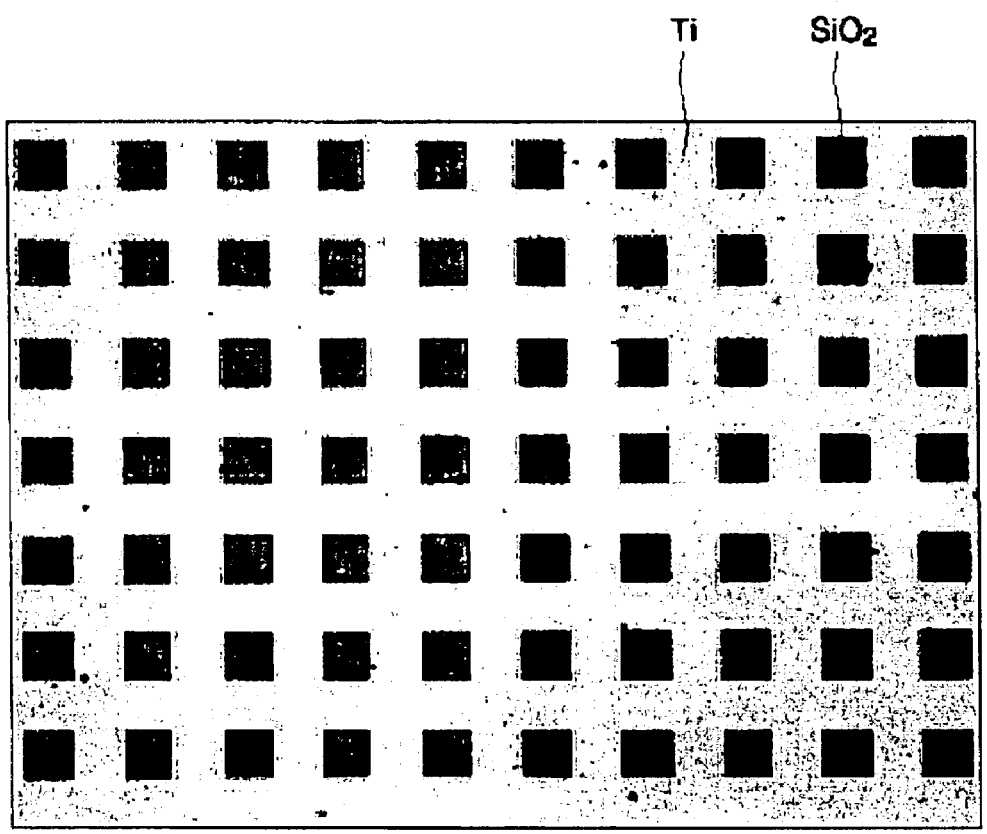
FIG. 6 is a picture illustrating an array of a Ti metal thin layer and a $SiO_2$ thin layer pattern formed on a $LiNbO_3$ plate.

Referring to FIG. 6, the photograph shows an array of a Ti metal thin layer and a SiO$_2$ thin layer formed on a LiNbO$_3$ plate.

Figure 7:
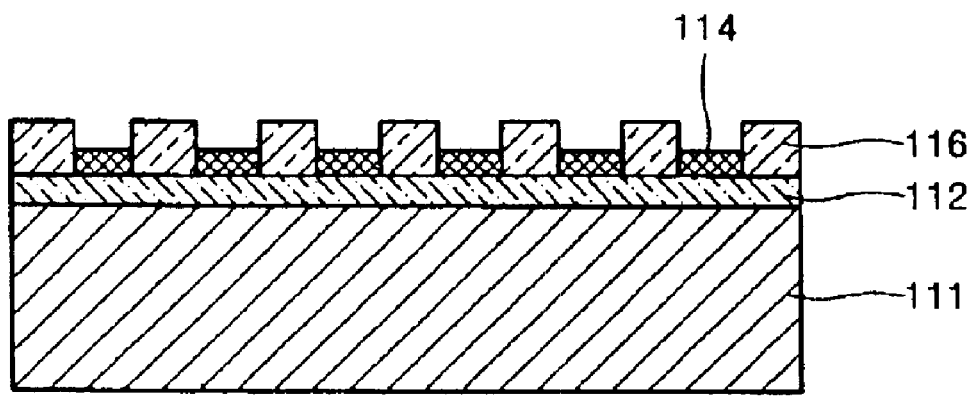
FIG. 7 illustrates a cross-sectional view of one modified example of an electron beam source used in the above embodiments of the present invention.

Referring to FIG. 7, there is illustrated a cross-sectional view of a modified example of an electron beam source used in the electron lithography apparatuses according to the above embodiments of the present invention. An adhesion layer 112 having a thickness of about 500 Å is formed on a pyroelectric plate 111. A patterned dielectric thin layer 116, which may be made of SiO$_2$, Si$_3$N$_4$, or TiO$_2$, is formed on the adhesion layer 112. A metal thin layer 114 is then formed at portions of the adhesion layer 112 exposed by the patterned dielectric thin layer 116. The adhesion layer 112 has a high durability and thus increases an adhesive strength between the metal thin layer 114 and the pyroelectric plate 111. The adhesion layer 112 may be formed of a material, such as SiO$_2$, Si$_3$N$_4$, or TiO$_2$, that is also a material of the dielectric thin layer 116. The electron beam source shown in FIG. 7 has a stable structure and operates in the same way as in the above-described embodiments of the present invention.

Figure 8A:
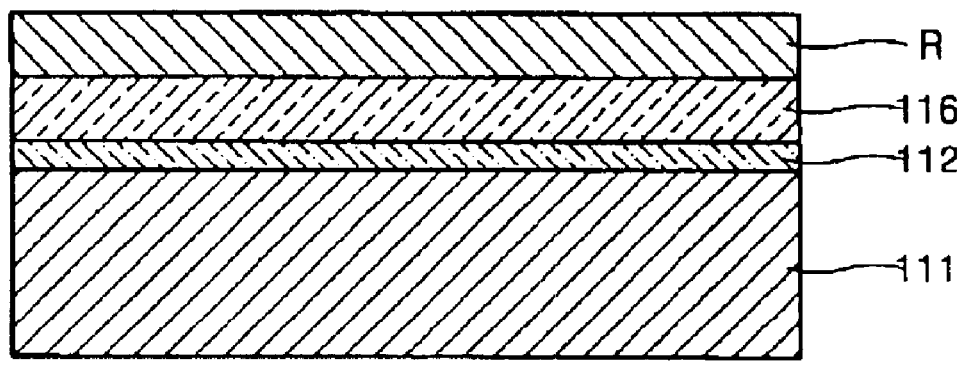
FIGS. 8A through 8E illustrate cross-sectional views of a process of fabricating a modified patterned pyroelectric emitter, which is the electron beam source, shown in FIG. 7.

Referring to FIGS. 8A through 8E, there are illustrated cross-sectional views of a process of fabricating a patterned pyroelectric emitter shown in FIG. 7. First, as shown in FIG. 8A, an adhesion layer 112 of a thickness of about 500 Å and a dielectric layer 116 of a thickness of about 1000 Å are sequentially deposited on a pyroelectric plate 111 having a predetermined thickness, e.g., a thickness of 1 mm. The pyroelectric plate 111 may be formed of a pyroelectric material such as LiNbO$_3$, LiTaO$_3$, and BaTiO$_3$. The dielectric layer 116 may be deposited by a CVD or a PVD technique using a material, such as SiO$_2$, Si$_3$N$_4$, and TiO$_2$, that may be patterned in nanometer scale dimensions. Next, a photosensitive resist R is coated on the dielectric layer 116. If the adhesion layer 112 and the dielectric layer 116 are formed of the same material, it is preferable that they are formed together to a thickness of about 1000–1500 Å.

Figure 8B:
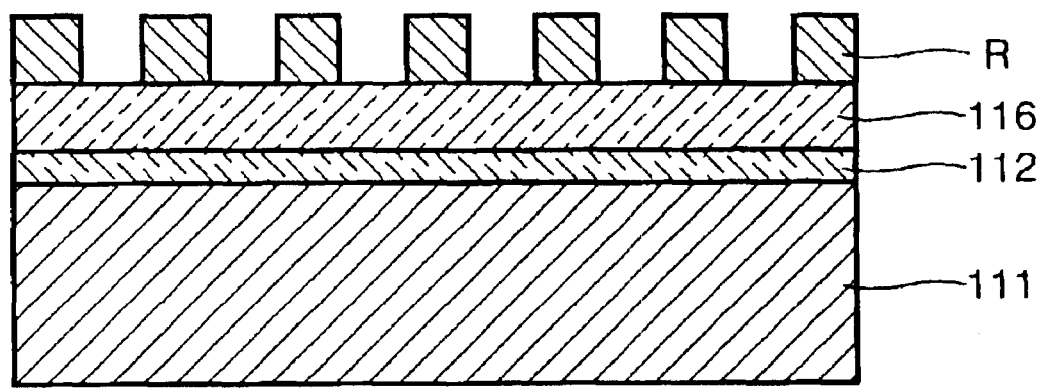

Thereafter, the photosensitive resist R is patterned through an exposure and a development by photolithography and electron beam lithography (see FIG. 8B). In this case, a LOR resist (not shown) and the photosensitive resist R may be sequentially deposited on the dielectric layer 116 for the subsequent lift-off process.

Figure 8C:
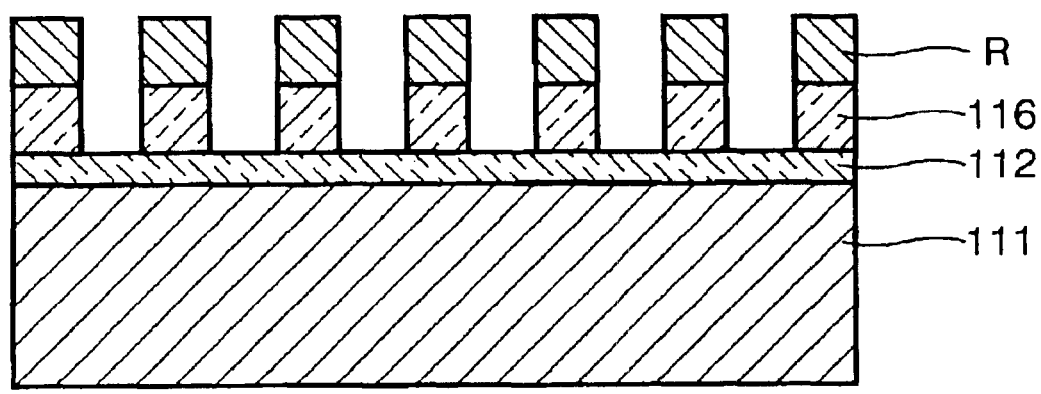
Figure 8D:
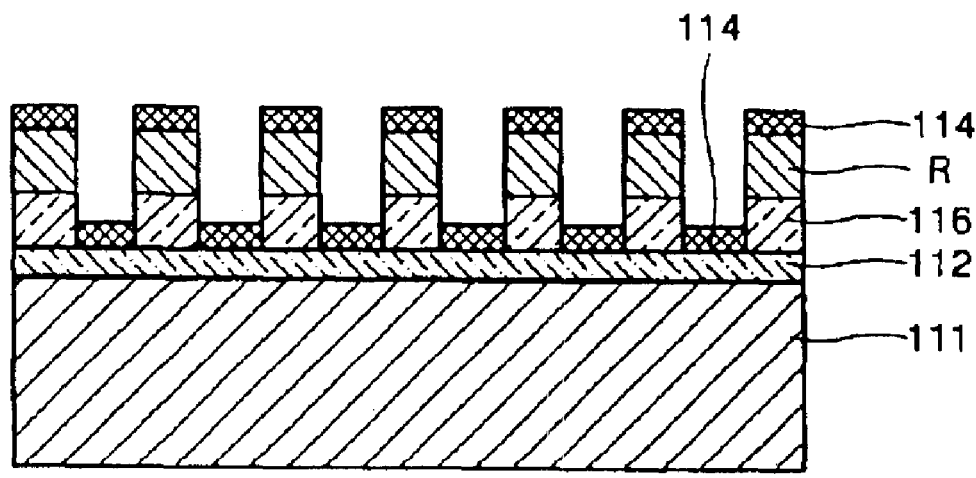

Referring now to FIG. 8C, the dielectric layer 116 is then patterned by reactive ion etching (RIE) using the patterned photosensitive resist R as a mask. At this point, if the dielectric layer 116 and the adhesion layer 112 are formed of the same material, it is preferable that etched layer 116 has, for example, a thickness of about 1000 Å and the adhesion layer 112 has, for example, a thickness of about 500 Å. This is accomplished by controlling the etching time. A metal thin layer 114 is then deposited on the pyroelectric plate 111 as shown in FIG. 8D. Preferably, the metal thin layer 114 is formed by a vacuum evaporation technique, which has a poor step coverage. The metal thin layer may be formed of Ti, Au, Pt, Ta, or Al to a thickness of about 500 Å.

Figure 8E:
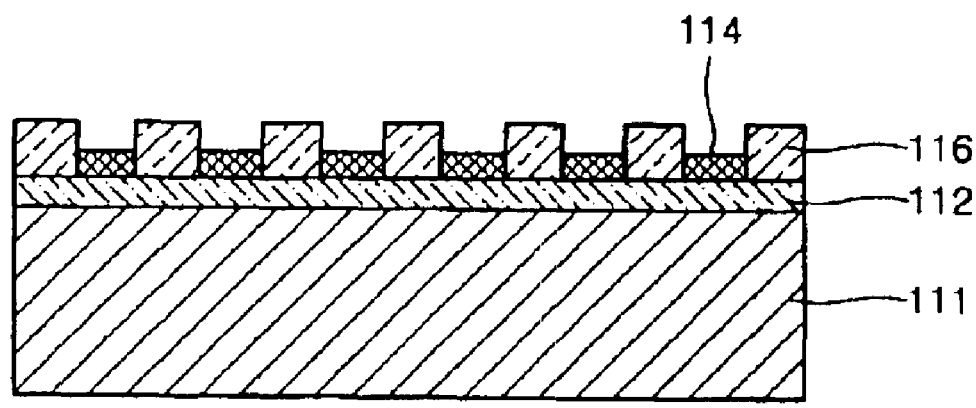

After the deposition of the metal thin layer 114, the remaining photosensitive resist R is removed using, for example, a lift-off process and ashing, to obtain an electron lithography apparatus in which the patterned metal thin layer 114 and the patterned dielectric layer are formed, as shown in FIG. 8E.

Figure 9:
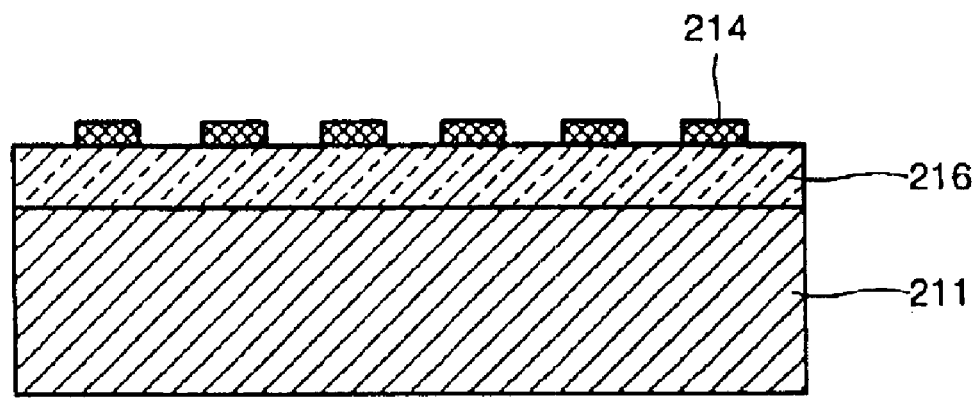
FIG. 9 illustrates a cross-sectional view of another modified example of an electron beam source used in the above embodiments of the present invention.

Referring to FIG. 9, there is illustrated a cross-sectional view of another modified example of an electron beam source used in the electron lithography apparatus according to the above embodiments of the present invention.

Referring to FIG. 9, a dielectric layer 216 having a thickness of about 1000 Å, which may be formed of SiO$_2$, Si$_3$N$_4$, or TiO$_2$, is deposited on a pyroelectric plate 211 and a patterned metal thin layer 214 is formed on the dielectric layer 216. The dielectric layer 216 has the same functions as the adhesion layer 112 of FIG. 7, that is, it has a high durability and enhances the adhesive strength between the metal thin layer 214, which is formed on the dielectric layer 216 and the pyroelectric plate 211.

When the pyroelectric plate 211 is heated, electron beams are emitted from portions of the dielectric layer 216 that are exposed by the patterned metal thin layer 214 on the pyroelectric plate 211. The heating source to heat pyroelectric plate 211 may be a contact-type heating plate, which uses a resistive-type heating, as described above in connection with an embodiment of the invention. Alternatively, the heating source may be a remotely controlled heater that generates infrared rays. The electron beam source shown in FIG. 9 performs the same operations as those in the aforementioned embodiments, and therefore, a detailed description thereof is omitted here.

Figure 10A:
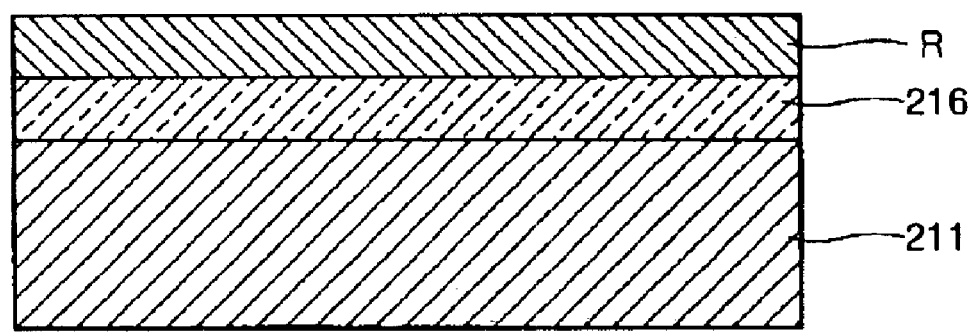
FIGS. 10A through 10D illustrate cross-sectional views of a process of fabricating the electron beam source shown in FIG. 9.
Figure 10B:
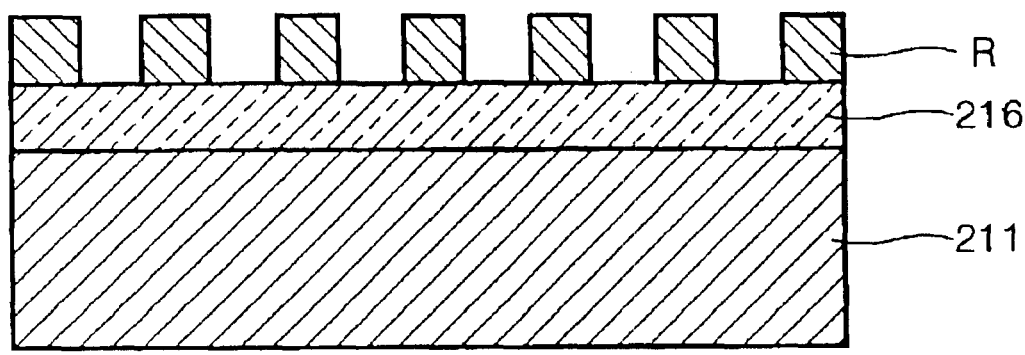

Referring now to FIGS. 10A through 10D, there are illustrated cross-sectional views of a process of fabricating the electron beam source of FIG. 9. As shown in FIG. 10A, a dielectric layer 216 is deposited to a thickness of about 1000 Å on a pyroelectric plate 211 having a predetermined thickness, e.g., a thickness of 1 mm. The pyroelectric plate 211 may be formed of a pyroelectric material such as LiNbO$_3$, LiTaO$_3$, and BaTiO$_3$. The dielectric layer 216 is deposited by a CVD or a PVD technique using a material, such as SiO$_2$, Si$_3$N$_4$, or TiO$_2$, that may be patterned in nanometer scale dimensions. A photosensitive resist R is then coated on the dielectric layer 216. The photosensitive resist R is then patterned through an exposure and a development by photolithography and electron beam lithography as shown in FIG. 10B. In this case, LOR™ resist (not shown) and the photosensitive resist R may be sequentially deposited on the dielectric layer 216 for the subsequent lift-off process.

Figure 10C:
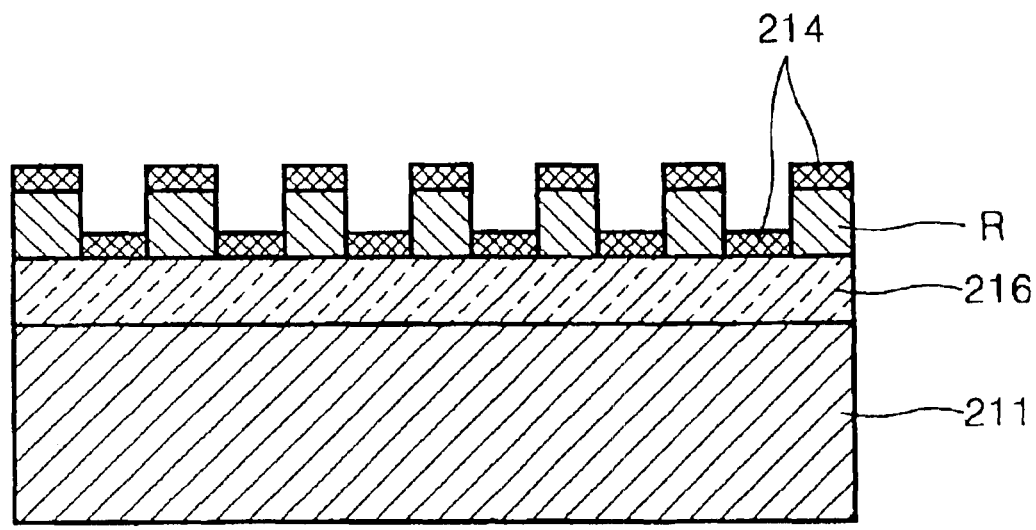
Figure 10D:
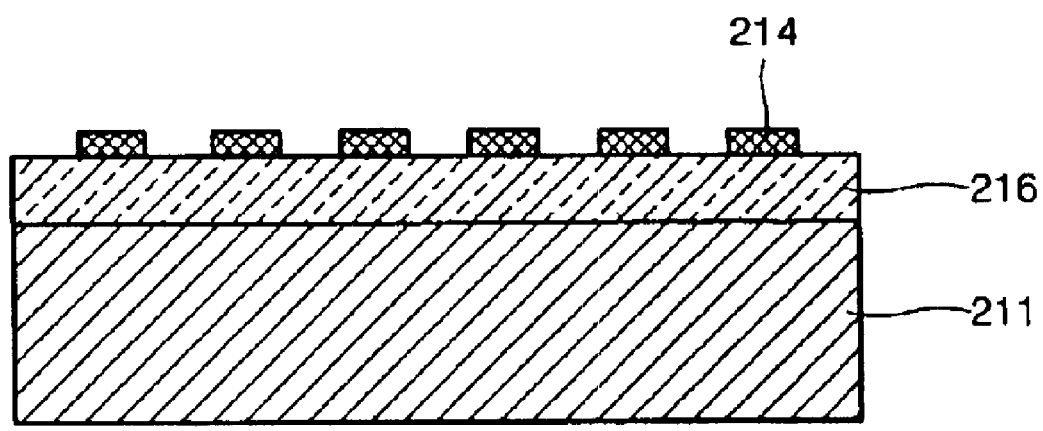

It is preferable that a vacuum evaporation technique, which has a poor step coverage, is thereafter performed on the pyroelectric plate 211 so as to form a metal thin layer 214 on the pyroelectric plate 211, as shown in FIG. 10C. The metal thin layer 214 may be formed of Ti, Au, Pt, Ta, or Al to a thickness of about 500 Å. Thereafter, the remaining photosensitive resist R is stripped, by a lift-off process, to acquire the patterned metal thin layer 214. After the lift-off process, the remaining photosensitive resist R is completely removed by ashing.

As described above, in an electron lithography apparatus using a patterned emitter, a pyroelectric emitter uses a patterned metal thin layer as a mask. When the emitter is heated, electrons are emitted from portions of the emitter coated with a dielectric layer (the portions without a metal thin layer on top), not from portions of the emitter covered with the patterned metal thin layer. Therefore, it is possible to precisely project a pattern of the emitter onto a substrate. To prevent dispersion of electron beams emitted from the emitter, the electron beams can be controlled using a permanent magnet, an elecro-magnet, or a deflector unit, thereby enabling a one-to-one projection or a x-to-one projection of a desired pattern. Details of the deflector unit are the same as described above in connection with another embodiment of the invention. Also, the pyroelectric emitter is capable of emitting an electron even at a low temperature such as 120° C. without applying a DC voltage to the pyroelectric emitter.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An electron beam lithography apparatus for providing a one-to-one projection of a pattern, the apparatus comprising:

a pyroelectric emitter which is disposed from a substrate holder at a predetermined distance, the emitter including a pyroelectric plate having a patterned dielectric layer on its surface facing the substrate holder, wherein portions of the surface of the pyroelectric plate exposed by the patterned dielectric layer are covered with a metal thin layer;

a heating source which heats the emitter; and a permanent magnet or an electro-magnet disposed outside the emitter and the substrate holder so as to control the paths of electrons emitted by the emitter.

2. The apparatus as claimed in claim 1, further comprising an adhesion layer of a predetermined thickness between the pyroelectric plate, and the dielectric layer and the metal thin layer.

3. The apparatus as claimed in claim 2, wherein the adhesion layer is formed of a dielectric material selected from the group consisting of $SiO_2$, $Si_3N_4$, and $TiO_2$.

4. The apparatus as claimed in claim 1, wherein the heating source is a contact-type heating plate using a resistive-type heating.

5. The apparatus as claimed in claim 1, wherein the heating source is a remotely controlled heater that generates infrared rays.

6. The apparatus as claimed in claim 1, wherein the pyroelectric plate is formed of a pyroelectric material selected from the group consisting of $LiNbO_3$, $LiTaO_3$, and $BaTiO_3$.

7. The apparatus as claimed in claim 1, wherein the dielectric layer is formed of a dielectric material selected from the group consisting of $SiO_2$, $Si_3N_4$, and $TiO_2$.

8. The apparatus as claimed in claim 1, wherein the metal thin layer is formed of a metal selected from the group consisting of Ti, Au, Pt, Ta, and Al.

9. An electron beam lithography apparatus for providing an x-to-one projection of a pattern, comprising:

a pyroelectric emitter which is disposed from a substrate holder at a predetermined distance, the emitter including a pyroelectric plate having a patterned dielectric layer on its surface facing the substrate holder, wherein portions of the surface of the pyroelectric plate exposed by the patterned dielectric layer are covered with a metal thin layer;

a heating source which heats the emitter; and a deflector unit which is disposed between the emitter and the substrate holder so as to control the paths of electrons emitted by the emitter.

10. The apparatus as claimed in claim 9, further comprising an adhesion layer of a predetermined thickness between the pyroelectric plate, and the dielectric layer and the metal thin layer.

11. The apparatus as claimed in claim 10, wherein the adhesion layer is formed of a dielectric material selected from the group consisting of $SiO_2$, $Si_3N_4$, and $TiO_2$.

12. The apparatus as claimed in claim 9, wherein the deflector unit comprises:

deflection plates which deflect electrons emitted by the emitter;

at least one magnetic lens which collimates the deflected electrons; and an aperture which filters the collimated electrons.

13. The apparatus as claimed in claim 9, wherein the heating source is a contact-type heating plate using a resistive-type heating.

14. The apparatus as claimed in claim 9, wherein the heating source is a remotely controlled heater that generates infrared rays.

15. The apparatus as claimed in claim 9, wherein the pyroelectric plate is formed of a pyroelectric material selected from the group consisting of $LiNbO_3$, $LiTaO_3$, and $BaTiO_3$.

16. The apparatus as claimed in claim 9, wherein the dielectric layer is formed of a dielectric material selected from the group consisting of $SiO_2$, $Si_3N_4$, and $TiO_2$.

17. The apparatus as claimed in claim 9, wherein the metal thin layer is formed of a metal selected from the group consisting of Ti, Au, Pt, Ta, and Al.

18. An electron beam lithography apparatus for providing a one-to-one projection of a pattern, comprising:

a pyroelectric emitter which is disposed from a substrate holder at a predetermined distance, the emitter including a pyroelectric plate having a patterned metal thin layer on its surface facing the substrate holder, wherein a dielectric layer is formed on the pyroelectric plate below the patterned metal thin layer;

a heating source which heats the emitter; and a permanent magnet or an electro-magnet disposed outside the emitter and the substrate holder so as to control the paths of electrons emitted from the emitter.

19. The apparatus as claimed in claim 18, wherein the heating source is a contact-type heating plate using a resistive-type heating.

20. The apparatus as claimed in claim 18, wherein the heating source is a remotely controlled heater that generates infrared rays.

21. The apparatus as claimed in claim 18, wherein the pyroelectric plate is formed of a pyroelectric material selected from the group consisting of $LiNbO_3$, $LiTaO_3$, and $BaTiO_3$.

22. The apparatus as claimed in claim 18, wherein the dielectric layer is formed of a dielectric material selected from the group consisting of $SiO_2$, $Si_3N_4$, and $TiO_2$.

23. The apparatus as claimed in claim 18, wherein the metal thin layer is formed of a metal selected from the group consisting of Ti, Au, Pt, Ta, and Al.

24. An electron beam lithography apparatus for providing an x-to-one projection of a pattern, comprising:

a pyroelectric emitter which is disposed from a substrate holder at a predetermined distance, the emitter including a pyroelectric plate having a patterned metal thin layer on its surface facing the substrate holder, wherein a dielectric layer is formed on the pyroelectric plate below the patterned metal thin layer;

a heating source which heats the emitter; and a deflector unit which is disposed between the emitter and the substrate holder so as to change the paths of electrons emitted from the emitter.

25. The apparatus as claimed in claim 24, wherein the deflector unit comprises:
deflection plates which deflect electrons emitted from the emitter;
at least one magnetic lens which collimates the deflected electrons; and
an aperture which filters the collimated electrons.

26. The apparatus as claimed in claim 24, wherein the heating source is a contact-type heating plate using a resistive-type heating.

27. The apparatus as claimed in claim 24, wherein the heating source is a remotely controlled heater that generates infrared rays.

28. The apparatus as claimed in claim 24, wherein the pyroelectric plate is formed of a pyroelectric material selected from the group consisting of $LiNbO_3$, $LiTaO_3$, and $BaTiO_3$.

29. The apparatus as claimed in claim 24, wherein the dielectric layer is formed of a dielectric layer selected from the group consisting of $SiO_2$, $Si_3N_4$, and $TiO_2$.

30. The apparatus as claimed in claim 24, wherein the metal thin layer is formed of a metal selected from the group consisting of Ti, Au, Pt, Ta, and Al.

* * * * *